(12) United States Patent
Tsujikawa et al.

(10) Patent No.: US 6,819,401 B2
(45) Date of Patent: Nov. 16, 2004

(54) EXPOSURE METHOD AND APPARATUS

(75) Inventors: Susumu Tsujikawa, Urayasu (JP); Yukio Taniguchi, Yokohama (JP); Hirotaka Yamaguchi, Kawasaki (JP); Masakiyo Matsumura, Kamakura (JP)

(73) Assignee: Kabushiki Kaisha Ekisho Sentan Gijutsu Kaihatsu Center, Yokohama (JP)

( * ) Notice: Subject to any disclaimer, the term of this patent is extended or adjusted under 35 U.S.C. 154(b) by 0 days.

(21) Appl. No.: 10/383,332

(22) Filed: Mar. 7, 2003

(65) Prior Publication Data
US 2003/0174302 A1 Sep. 18, 2003

(30) Foreign Application Priority Data
Mar. 14, 2002 (JP) .......................... 2002-069893

(51) Int. Cl.[7] .................. G03B 13/28; G03B 27/54; G03B 27/70
(52) U.S. Cl. ................ 355/66; 355/45; 355/60; 355/67

(58) Field of Search ............... 355/43, 45, 49, 355/51, 53, 60, 66, 67

(56) References Cited

U.S. PATENT DOCUMENTS

| | | | | |
|---|---|---|---|---|
| 3,819,265 A | * | 6/1974 | Feldman et al. | 355/51 |
| 5,393,623 A | * | 2/1995 | Kamon | 430/5 |
| 5,418,599 A | * | 5/1995 | Kamon | 355/77 |
| 5,793,473 A | * | 8/1998 | Koyama et al. | 355/55 |

* cited by examiner

Primary Examiner—Rodney Fuller
(74) Attorney, Agent, or Firm—Graybeal Jackson Haley LLP

(57) ABSTRACT

An exposure method includes the light incidence step of letting at least a part of light emitted from a light source for exposure use be incident on a mask supported by a supporting device, and the imaging step of forming an image of a mask pattern on a photosensitive material by guiding the reflecting light from the mask such that the photosensitive material supported by the supporting device receives the reflecting light coming from an incidence direction which is different from the incidence direction of the light incident on the mask.

22 Claims, 5 Drawing Sheets

EXPOSURE METHOD AND APPARATUS

The applicants hereby claim priority to Japanese patent application No. 2002-069893, filed Mar. 14, 2002, which is incorporated by reference.

BACKGROUND OF THE INVENTION

1. Field of the Invention

The present invention relates to a method of exposing the pattern of an exposure mask (referred to as "mask" hereinafter) to the light, thereby imaging the mask pattern on a photosensitive material, and also relates to an aligner for executing the method. Especially, the invention relates to a preferable exposure method and aligner as an exposure technique applicable for instance to the photolithographic process in the manufacture of a semiconductor integrated circuit (SIC), a liquid crystal display (LCD), a flexible print circuit board and so on; and also as an exposure technique applicable for instance to a scanner for use in a printing plate maker, an electronic copy machine and so forth.

2. Prior Art

Among various kinds of aligners as used in the photolithographic process, one of the processes for manufacturing SIC, LCD, etc, there is an aligner called a projection aligner. This aligner exposes the mask pattern to the light to image it on the photosensitive material with the help of an imaging optical system. In case of the aligner of this kind, some include an imaging optical system arranged between a holder for holding the mask and a stage for supporting the photosensitive material.

In this projection aligner, if an imaging device used as the imaging optical system has a large dimension, the holder and the stage cannot help being arranged apart from each other at a large distance. In order to obviate inconvenience like this, there might be considered various things, for instance a mechanism for holding the holder and the stage in parallel, a mechanism for adjusting the relative position between the holder and the stage, and/or a mechanism for moving the holder and the stage and so on. It should not be forgotten, however, that newly designing and manufacturing such mechanisms with new dimension and accuracy never fails to invite considerable cost increase.

Furthermore, in the projection aligner, the holder is arranged on the upper side within the space of the optical system while the stage is arranged on the lower side within the same. Therefore, the projection aligner has to be designed always-taking account of the positional relation among the optical system, the holder, and the stage. This is another inconvenience to be removed.

In order to eliminate such inconvenience as described above, there has been proposed an projection aligner wherein the mask and the photosensitive material are supported by an identical stage such that the their respective surfaces on which the light is incident are on an identical plane, and the light from a light source is first incident on the mask, and then, the light passing through the mask forms an image on the photosensitive material by using the imaging optical system (U.S. Pat. No. 5,652,645 Specification).

Consequently, in case of the projection aligner as disclosed by the above USP, there is no need for various mechanisms to be prepared. For instance, it would be no longer necessary to prepare a mechanism for maintaining the parallelism which is required when vertically arranging the mask and the photosensitive material such that they sandwich the imaging optical system between them, the mechanism for adjusting the positional relation among three of them, and the mechanism for moving three of them. Even though they are needed, their structure would be much more simplified. This would be an advantageous point of the invention disclosed by the above USP. Also, it would be another merit of the invention of this USP that the space needed in the vertical direction is reduced.

In spite of advantageous points as described above, it seems that the projection aligner disclosed by the above USP still include the problems to be solved. For instance, in case of imaging the mask pattern on the photosensitive material film formed on a glass substrate for use in the LCD panel, the stage is required to have a dimension corresponding to the dimension of the mask and photosensitive material film as used, thus the necessary space being increased. Furthermore, it is also difficult and inconvenient to move the stage having a large dimension at a high speed due to its weight and inertia.

Still further, if the imaging optical system having a large dimension is used in order to realize the high precision exposure, for instance to realize a deeper depth of focus, the mask and the photosensitive material have to be arranged on the stage apart from each other at a large distance. In order to avoid this, if the imaging optical system is installed inside the projection aligner such that the light vertically runs inside the imaging optical system, there are caused such a problem that increases the space needed in the vertical direction as well as the optical path length from the mask to the photosensitive material.

Accordingly, an object of the invention is to make the space necessary for supporting the mask and the photosensitive material as small as possible.

SUMMARY OF THE INVENTION

According to the invention, there is provided an exposure method of exposing an exposure mask pattern on a photosensitive material. This method includes the steps of letting at least a part of the light emitted from a light source be incident on the mask supported by a supporting device; and forming an image of the mask pattern on the photosensitive material by guiding the reflecting light from the mask such that the photosensitive material supported by the supporting device receives the reflecting light coming from an incident direction which is different from the incidence direction of the light incident on the mask.

According to the invention, there is provided an aligner for exposing an exposure mask pattern on a photosensitive material. This aligner includes the first supporting device for supporting said mask such that said mask receives at least a part of the light from said light source; the second supporting device for supporting said photosensitive material such that said photosensitive material receives the reflecting light from said mask from the direction which is different from said incident light direction toward said mask; a half mirror arranged on the way of the light path between said light source and said mask, said half mirror allowing at least a part of the light from said light source to pass through itself and changing the proceeding direction of the reflecting light from said mask; and an imaging optical system for focusing the reflecting light from said half mirror into an image on said photosensitive material.

According to the invention, the reflecting light from the mask is guided to be incident on the photosensitive material from a certain light incidence direction, which is different from the incidence direction of the light incident on the mask. In other words, the incidence direction of the light incident on the mask is different from that of the above reflecting light incident on the photosensitive material.

Furthermore, according to the invention, neither the mask nor the photosensitive material is supported by an identical stage such that their respective light incidence faces come to be on the approximately same plane. Accordingly, it becomes free to properly select respective incidence directions of the reflecting light incident on the photosensitive material and the light incident on the mask such that they become different from each other. This would bring a considerable merit. For instance, if the incidence direction of the light incident on the mask is made opposite to that of the reflecting light incident on the photosensitive material, it will be possible to reduce a space for supporting the mask and the photosensitive material to be much smaller.

An exposure method according to the invention may further includes a moving step of two-dimensionally and relatively moving the light incident on the mask and the light incident on the photosensitive material to the supporting device. With this step, it becomes possible to two-dimensionally and relatively moving the exposure light to the mask and the photosensitive material, and to use even a region having a small area as an irradiation region for use in the light exposure (irradiation), thus making it possible to reduce the dimension of the light source device and the imaging optical system.

The above imaging step may include a direction change step of changing the proceeding direction of the reflecting light from the mask through a half mirror arranged on the way of a light path between the light source and the mask; and a step of further changing the proceeding direction of the light of which the proceeding direction has been changed through a plurality of reflecting mirrors and a least one imaging lens, and focusing the direction-changed light into an image on the photosensitive material through at least one imaging lens. With this, it becomes possible to let at least a part of the light from the exposure light source be incident on the mask as well as to change the proceeding direction of the reflecting light from the mask. Still further, it also becomes possible to easily invert the incidence direction of the light incident on the mask as well as the incidence direction of the reflecting light incident on the photosensitive material, thus the space necessary for supporting the mask and the photosensitive material becoming smaller.

The above imaging step may further include a step of changing the proceeding direction of at least a part of the light incident on a light incidence face by using a prism arranged on the way of the light path between the half mirror and the photosensitive material, the prism having a light incidence face on which the light is incident and an light exit face from which the incident light comes out. With this, it becomes possible to use an optical system having a small dimension, thus the size of the entire aligner becoming smaller.

The above light incidence step may further include a steps of letting at least a part of the light from the light source be incident on the second photosensitive material, which is supported by the supporting device so as to be located on the opposite side of the mask side. With this, it becomes possible to expose two photosensitive materials to the exposure light at a time.

The above imaging optical system may further includes the half mirror, a plurality of reflecting mirrors arranged on the way of the light path between the half mirror and the photosensitive material, and at least one imaging lens. With this, it also becomes possible to easily invert the incidence direction of the light incident on the mask as well as the incidence direction of the reflecting light incident on the photosensitive material, thus the space necessary for supporting the mask and the photosensitive material becoming smaller.

The above imaging optical system may further include a prism having at least two faces on the one of which the light is incident and from the other of which the incident light comes out. The prism is arranged on the way of the light path between the half mirror and the photosensitive material and changes the proceeding direction of at least a part of the light incident on the light incidence face. With this, it becomes possible to use an optical system having a small dimension, thus the size of the entire aligner becoming smaller.

The above first supporting portion may support the second photosensitive material to locate it on the side opposite to the light incidence side of the mask side. With this, it becomes possible to expose two photosensitive materials together to the exposure light at a time.

The invention will now be described in detail by way of several examples with reference to the accompanying drawings, wherein constituents of the invention having like function and structure will be denoted with like reference numerals and characters in order to avoid the redundant repetitive description.

DETAILED DESCRIPTION OF THE PREFERRED EMBODIMENTS (First Embodiment)

Figure 1:
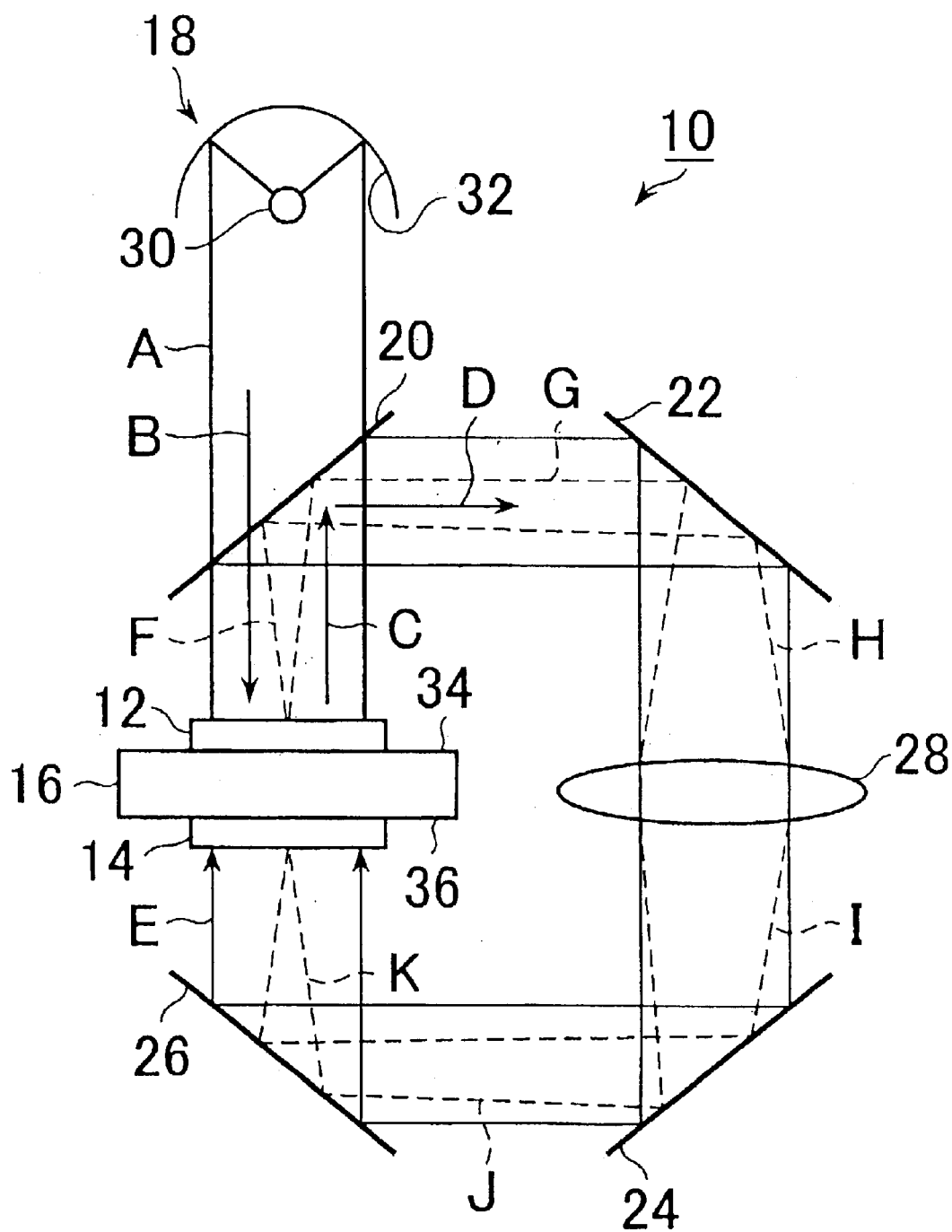
FIG. 1 is a side view showing the first embodiment of an aligner according to the invention.

Referring to FIG. 1, an aligner 10 includes a supporting device 16 for supporting a mask 12 and the subject to be exposed (referred to as the exposure subject hereinafter) 14, a half-mirror 20 arranged on the light path between a light source device 18 and the mask 12, three reflecting mirrors 22, 24, 26 respectively arranged at each corner of an imaginary rectangular shape or the like made up of the above half-mirror and reflecting mirrors, and an imaging lens 28 arranged on the light path between the reflecting mirrors 22 and 24.

In the description relating to FIG. 1, the direction toward the upside or the downside is called "upward direction" or "downward direction" or the like; the direction toward the left-hand side or the right-hand side is called "left-hand direction" or "right-hand direction" or the like; the direction perpendicular to the surface of paper (i.e. FIG. 1) is called "front and back direction" or the like; the direction from the front to the back of paper is called "forward direction" or the like; and the direction from the back to the front of paper is called "backward direction" or the like.

The light source device 18 includes a light source 30 and a concave mirror 32 as well, and is arranged in the approximately vertical and upward direction in view of the position where the mask 12 is supported by the supporting device 16.

At least a part of the light from the light source 30 is processed to be in the shape of a parallel light flux A. The light source 30 may be formed of an ultra-high pressure mercury lamp or the like.

The mask 12 may be made of a light transmittable glass substrate, on the one surface of which a light reflecting metal film is formed so as to have a predetermined pattern.

The exposure subject 14 may be made up of a base material plate and a photosensitive layer formed on the base material plate. The exposure subject 14 as shown in FIG. 1 has the approximately same size as the mask 12.

The supporting device 16 receives the mask 12 on its upside supporting portion 34 such that the above metal film looks up and the upside supporting portion 34 is detachably equipped with the mask 12 by means of an upside fitting means (not shown).

Furthermore, the supporting device 16 receives the exposure subject 14 at its downside-supporting portion 36 such that the photosensitive layer of the exposure subject 14 looks downward and is located to come approximately under the mask 12. The downside-supporting portion 36 is detachably fitted with the exposure subject 14 by means of a downside-fitting means (not shown).

As described above, since the exposure subject 14 is located approximately under the mask 12, the dimension of the supporting device 16 in the left-to-right direction becomes smaller by far, comparing with the case where both of the mask 12 and the exposure subject 14 are fitted together on the upside of the supporting device 16.

The half mirror 20 is called a semi-transparent mirror and typically includes a flat glass substrate and a metal or dielectric film formed on the glass substrate by means of vapor deposition. The half mirror 20 allows at least a part of the incident light to transmit through itself while it reflects at least a remainder part in correspondence with the incidence direction and angle of the incident light. The half mirror 20 is arranged on the way of the light path between the light source device 18 and the mask 12 such that it makes an angle of approximately 45 to the light flux A incident on the mask 12 at right angles, approximately.

The half mirror 20 allows at least a part of the light from the light source 30 to transmit through itself, and then guides the transmission light to the mask 12. Furthermore, the half mirror 20 changes the proceeding direction of the light reflected by the mask 12 from an arrow head C direction to an arrow head D direction, in other words, the half mirror 20 reflects the light reflected by the mask 12 in the direction at a right angle to the arrow head C direction, approximately.

Three reflecting mirrors 22, 24, 26 sequentially change the proceeding direction of the reflected light from the half mirror 20 at a right angle each and guides the reflected light as a light flux E up to the exposure subject 14, eventually.

An imaging lens 28 focuses the reflected light from the reflection mirror 22 into an image on the photosensitive layer of the exposure subject 14 such that the pattern of the mask 12 is optically transferred to the photosensitive layer of the exposure subject 14 at an equal scale factor. (Conceptual light path of the imaging light is indicated by dotted lines G, H, I, J, and K).

In the next, there will be described an exposure method of the lump sum type wherein the entire pattern face of the mask 12 is exposed to light at a time by means of the aligner 10. Prior to the actual exposure operation, the supporting device 16 is fitted with the mask 12 and the exposure subject 14 according to a predetermined work rule.

With the operation of a control panel (not shown) of the aligner 10, a start signal is outputted to a controller (not shown). The controller having received the start signal transmits a lighting start signal to the light source device 18, which then turns on the light source 30 for a predetermined period of time. The concave mirror 32 reflects the light emitted from the light source 30, thereby the light flux A being generated.

The half mirror 20 permits at least a part of the light flux A to transmit through itself. This transmission light proceeds in the direction indicated by an arrow head B and is incident on the mask 12. At least a part of the incoming light to the mask is reflected by the metal film of the mask 12 and proceeds in the direction indicated by the arrow head C. The light reflected by the half mirror 20 is bent in the direction of the arrow head D, namely, bent at a right angle to the direction of the arrow head C and then, is guided to the reflecting mirror 22.

The reflecting mirror 22 bends the proceeding direction of the reflected light from the half mirror 20 approximately at a right angle, and guides that reflected light to the imaging lens 28. This lens 28 guides the reflected light from the reflecting mirror 22 to the reflecting mirror 24 such that the reflected light from the reflecting mirror 22 images on the photosensitive layer of the exposure subject 14. The reflecting mirror 24 bends the proceeding direction of the light from the imaging lens 28 approximately at a right angle to guide it to the reflecting mirror 26. This mirror 26 guides the reflected light from the reflecting mirror 26 as a light flux E to the photosensitive layer of the exposure subject 14.

The light guided to the photosensitive layer of the exposure subject 14 images on this photosensitive layer, by which the pattern of the mask 12 is optically transferred to the photosensitive layer of the exposure subject 14. After the exposure, the exposure subject 14 is taken out from the supporting device 16. Then, the photosensitive layer of the exposure subject 14 is subject to the process of development.

The light flux A incident on the mask 12 and the light flux E incident on the photosensitive layer of the exposure subject 14 place their optical axes on the approximately identical line and respective sectional areas of them are approximately equal to each other, but the incidence directions of the above two light fluxes A and E are opposite to each other. Therefore, they may be arranged such that the light flux A and the same E are incident on the mask 12 and the exposure subject 14, respectively.

As described above, if the supporting device 16 is fitted with the mask 12 and the exposure subject 14 such that their back sides face to each other, there would be obviated such a problem that when both of the mask and the exposure subject are arranged on the upper side of the supporting device, the distance between them depends on the size of the imaging lens. Accordingly, it becomes possible to minimize the area necessary for supporting the mask and the exposure subject.

In the exposure by using the aligner 10, the pattern image of the mask 12 is optically transferred to the photosensitive layer of the exposure subject 14 as a pattern image in which the left-and-right side is inverted. Therefore, the mask 12 has to be designed by sufficiently taking account of this inversion. In other words, the mask 12 has to be provided with a pattern, which is obtained by intentionally inverting the left-and-right side of the truly intended pattern.

The aligner 10 is not limited to the above-mentioned constitution and it is possible to change and modify it as mentioned in the following, for instance.

For instance, the downside-supporting portion 36 may use an absorption supporting plate including a plurality of holes or grooves for firmly sucking and fixing the exposure subject 14 by means of an adsorption device (not shown).

In order to align the exposure subject 14 and the mask 12 with high accuracy, it may be possible to equip the downside supporting portion 36 with a position adjustment device like a XYθ-table and further to equip this position adjustment device with the exposure subject 14.

In the above description, the imaging lens 28 is explained as a single lens, but it may be possible to use a plurality of lenses corresponding to resolutions as required. For instance, a telecentric optical system having an image magnification factor of 1 to 1 may be used as an example of a plural lens system.

There is no special limitation with respect to the arrangement of the imaging lens 28 as far as it is arranged to form the mask pattern image on the photosensitive layer of the exposure subject 14. Accordingly, even though the design of the lens constitution is properly changed, it is allowed wherever the lens 28 is located as long as it is on way of the light path between the half mirror 20 and the exposure subject 14.

The location and constitution of the imaging lens 28 may be changed as far as the pattern of the mask 12 is optically transferred to the photosensitive layer of the exposure subject 14 at a desired magnification or reduction factor.

As to the light source device 18, it is enough if it is arranged such that the light flux A is almost vertically incident on the mask 12. Furthermore, it may be possible to locate the light source device 18 on the oblique upside or the lateral side of the supporting device 16 and to guide the light from the light source 30 to the mask 12 such that the light is almost vertically incident on the mask 12 with the help of an optical guide system such as the reflecting mirror, luminous optical system and so forth.

In order to prevent the exposure failure caused by the incident light for instance a retrograding light to the light transmission portion (having no metal film) of the mask 12, it is possible to locate a light absorbing member between the opposite side of the light incident side of the mark 12 and the upside supporting portion.

The mask may be provided with a light-absorbing layer for preventing the exposure failure due to the unnecessary light.

The exposure subject 14 may be made of a flexible film substrate having a conductive layer and a photosensitive layer formed on the above film substrate. If the film substrate is made of a ribbon shaped film, using means for moving the ribbon shaped film can change the exposure position of the pattern of the ribbon shaped film mask 12.

(Second Embodiment)

Figure 2:
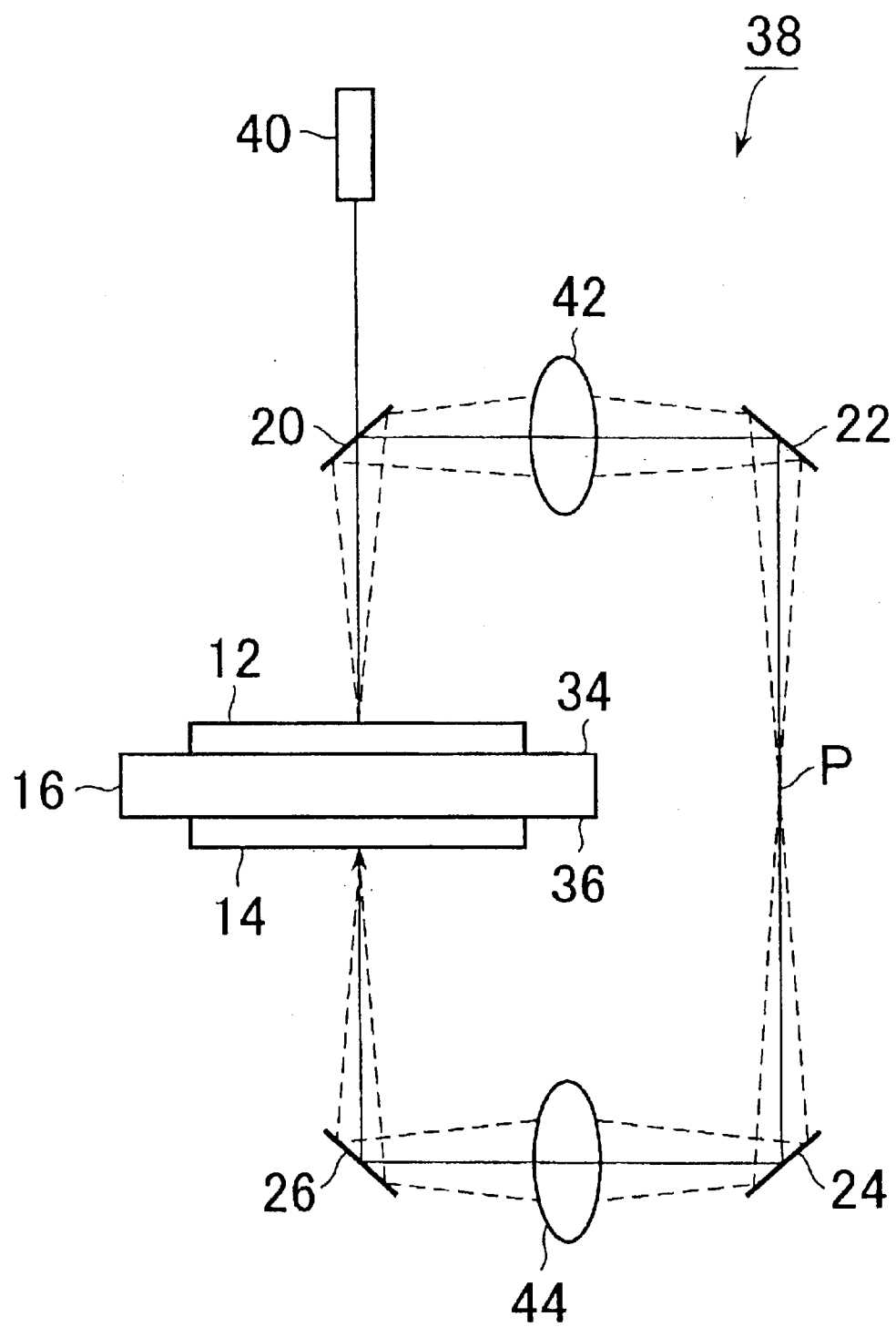
FIG. 2 is a side view showing the second embodiment of an aligner according to the invention.

Referring to FIG. 2, an aligner 38 includes parts common to those of the aligner 10 shown in FIG. 1, which are designated by common reference numerals and signs, and some of which are omitted from FIG. 2. As to expression on the various directions such as upward, downward and so forth, the same way as used in FIG. 1 will be applied to this figure.

Now, the aligner 38 as shown in FIG. 2 is what is called a scanning aligner carrying out the exposure by two-dimensionally and relatively moving the light to the mask 12 and the exposure subject 14.

A light source device 40 generates a light-source light of which the flux section is shaped to irradiate a comparatively small region (for instance a circular region with a diameter of about 20 mm). The region irradiated by the light-source light like this may have a circular or hexagonal shape.

The supporting device 16 supports the mask 12 and the exposure subject 14 in the same way as the aligner 10 in FIG. 1 does. The supporting device 16 is fitted with an X-Y driving mechanism (not shown) so as to move together with it. The supporting device 16 is moved in the back-and-forth direction as well as in the left-and-right direction.

In the aligner 38, an imaging lens 42 is arranged between the half mirror 20 and the reflecting mirror 22 while an imaging lens 44 is arranged between two reflecting mirrors 24 and 26. The imaging lens 42 focuses the reflected light from the half mirror 20 into an image at a point P on the way of the light path between two reflecting mirrors 22 and 24. On one hand, the imaging lens 44 focuses the reflected light from the reflecting mirror 24 into an image on the photosensitive layer of the exposure subject 14 such that the pattern of the mask 12 is optically transferred to the photosensitive layer of the exposure subject 14 at a equal magnification factor (Conceptual light path of the imaging light is indicated by dotted lines).

The reflecting light from the mask 12 is focused into an image in the position P and then, is further imaged on the photosensitive layer of the exposure subject 14. The image by the light focused on the position P can be seen as a real image if a certain screen is spread in the position P, for instance.

In the aligner 38, similarly to the case of the aligner 10, the light incident on the mask 12 and the light incident on the photosensitive layer of the exposure subject 14 places their optical axes on the approximately identical line, but the incidence directions of the above two incident lights are opposite to each other. Furthermore, in the exposure by using the aligner 38, the pattern image of the mask 12 is optically transferred to the photosensitive layer of the exposure subject 14 as a pattern image in which the left-and-right side is inverted. Therefore, the mask 12 has to be designed by sufficiently taking account of this inversion. In other words, the mask 12 has to be provided with a pattern, which is obtained by intentionally inverting the left-and-right side of the truly intended pattern.

In the next, there will be explained an exposure method as called scanning exposure by using the aligner 38 wherein the exposure is carried out by two-dimensionally and relatively moving the light to the mask 12 and the exposure subject 14 as well.

Figure 3:
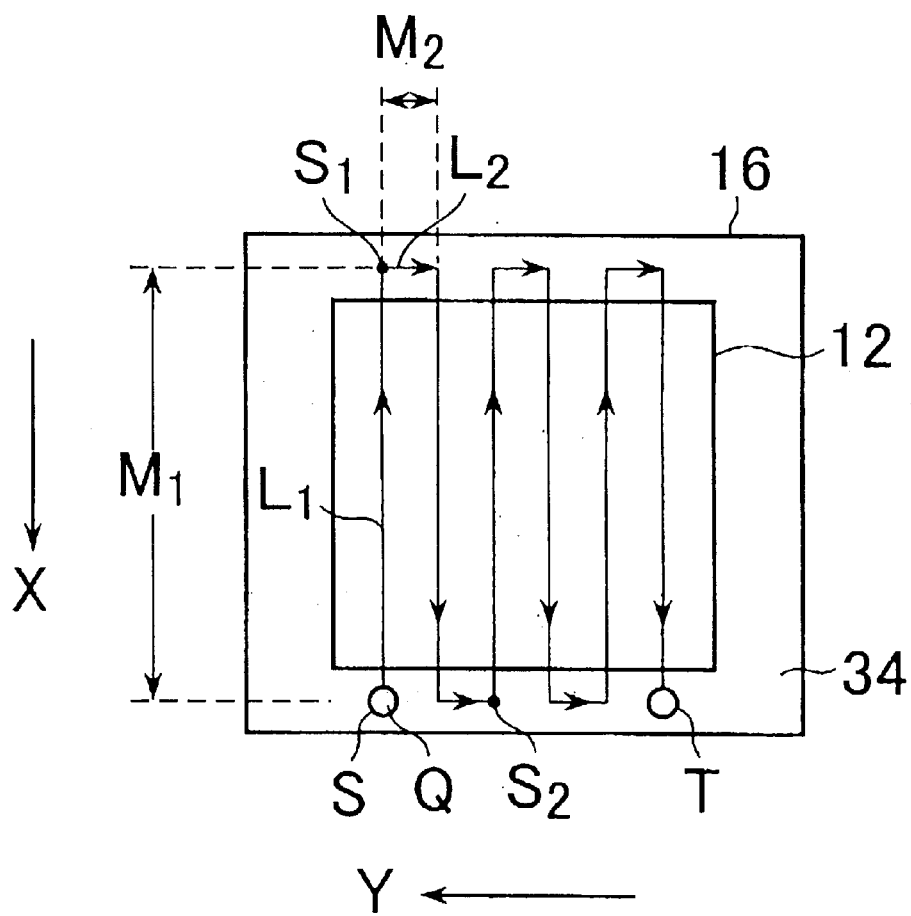
FIG. 3 is a diagram indicating a moving pattern of a supporting device when executing the scanning exposure by means of the aligner as shown in FIG. 2.

Before beginning the actual exposure, the supporting device 16 is fitted with the mask 12 and the exposure subject 14 according to a predetermined work rule. Furthermore, as shown in FIG. 3, the supporting device 16 is moved in advance by using the X-Y driving mechanism such that the region Q to be irradiated by the light-source light is located in the start position S of the upside supporting portion 34 of the supporting device 16 receiving the mask 12.

In the actual exposure, that is, the scanning exposure, the following two steps are simultaneously performed; one is the step of irradiating the mask 12 by the light-source light, guiding the reflecting light from the mask to the exposure subject 14 by the optical system, and exposing it to the light, and the other is the step of moving the supporting device 16 approximately in parallel with the X-Y plane by the X-Y driving mechanism. This will be further described in detail in the following.

In response to an exposure start signal, the light source device 40 starts generating the light-source light. Similar to the exposure in the aligner 10 as shown in FIG. 1, the light-source light passing through the half mirror 20 irradiates the mask 12 while the reflecting light from the half mirror 20 is guided to the photosensitive layer of the exposure subject 14 through the half mirror 20 and reflecting mirrors 22, 24, and 26.

In the exposure using the aligner 38, the reflecting light from the mask 12 is focused into an image on the photosensitive layer of the exposure subject 14 by two imaging lens 42 and 44.

On one hand, the X-Y driving mechanism drives the supporting device 16 in the backward direction at a predetermined speed by a distance of $M_1$ such that the irradiation region Q which is located at the start position and is irradiated by the light-source light is relatively moved to the mask 12 in the direction of a arrow head $L_1$ in FIG. 3 by a distance of $M_1$.

This distance $M_1$ is set to be longer than the front-to-back length of the mask 12 by at least twice as long as the diameter of the circular irradiation region Q. With this backward movement of the supporting device 16, the irradiation region continues to scan the mask 12 until it reaches the side end of the mask 12.

If the irradiation region Q goes over the area of the mask 12 and gets in the position $S_1$ on the upside supporting portion 34, the X-Y driving mechanism drives the supporting device 16 at a predetermined speed in the left-hand direction by a distance of $M_2$ such that the irradiation region Q is relatively moved to the mask 12 in the direction of a arrow head $L_2$ in FIG. 3 by a distance of $M_2$. This distance $M_2$ is set in advance in correspondence with the size of the irradiation region Q.

Furthermore, the X-Y diving mechanism drives the supporting device 16 in the forward direction by a distance of $M_1$ and then drives the supporting device 16 in the left-hand direction by a distance of $M_2$. At this time, irradiation region Q is located in the position $S_2$.

The X-Y driving mechanism repeats the above-mentioned way of driving the supporting device 16 until the irradiation region Q reaches the end position T, in other words, until there is finished the irradiation by the light-source light to the entire surface of the mask 12. With this, the entire surface of the mask 12 is optically transferred to the photosensitive layer of the exposure subject 14.

As described above, in the scanning exposure by the aligner 38, the scanning exposure is carried out by moving the supporting device 16. Instead of driving the supporting device 16, however, it may be possible to perform the scanning exposure by two-dimensionally and relatively moving the optical system made up of the light source device 40, the half mirror 20, reflecting mirrors 22, 24, 26, and imaging lens 42 and 44, as a one body to the supporting device 16.

(Third Embodiment)

Figure 4:
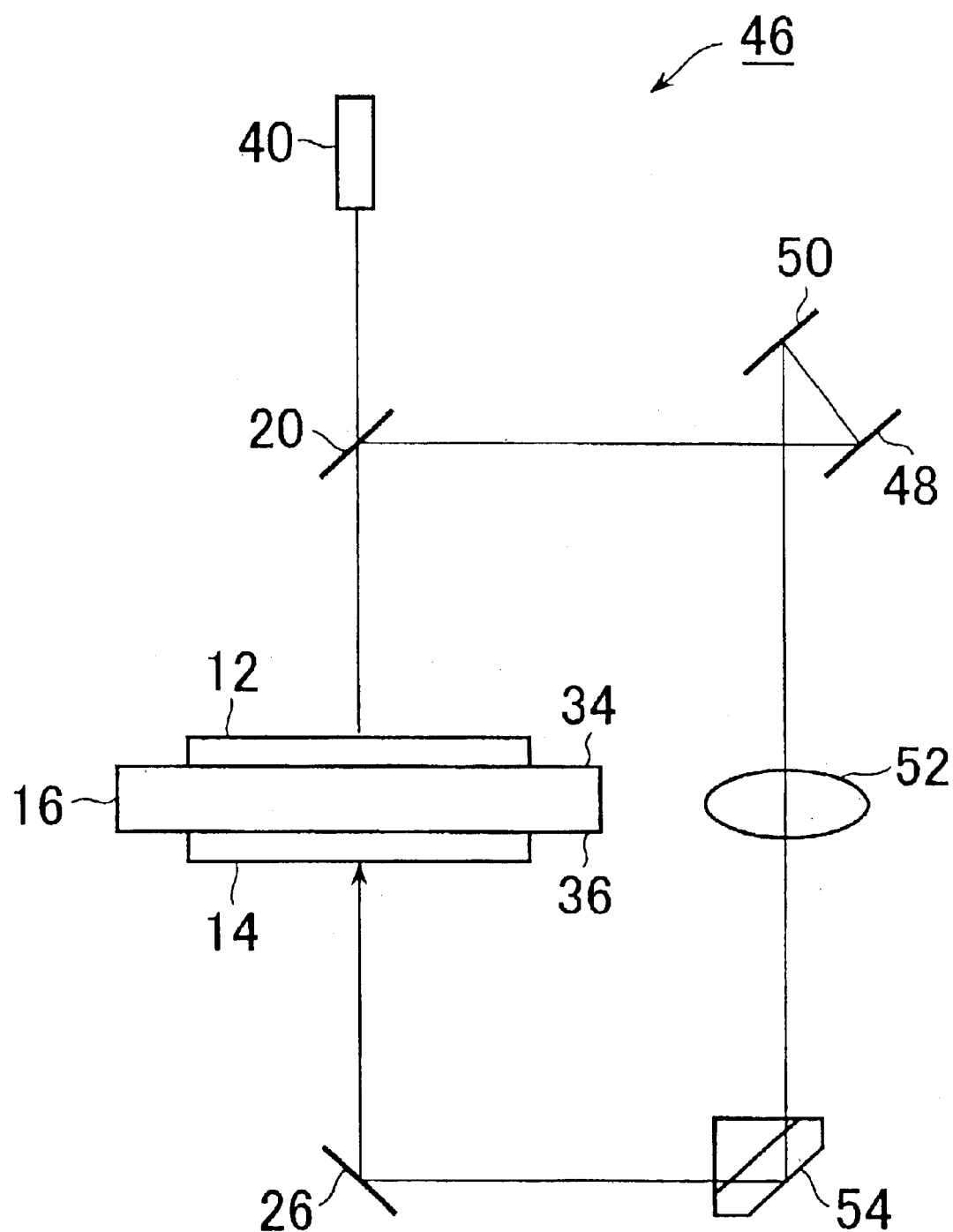
FIG. 4 is a side view showing the third embodiment of an aligner according to the invention.

In FIG. 4, an aligner 46 includes parts common to those of the aligners 10 and 38 as shown in FIGS. 1 and 2, which are designated by common reference numerals and signs, and some of which are omitted from FIG. 4. As to expression on the various directions such as upward, downward and so forth, the same way as used in FIGS. 1 and 2 will be applied to this figure.

Referring to FIG. 4, similar to the case of the aligner 10 shown in FIG. 1, the mask 12 and the exposure subject 14 are supported by the supporting device 16, which can be moved by the X-Y mechanism (not shown) in the back-and-forth or left-and-right direction.

The proceeding direction of the reflecting light from the half mirror 20 is changed and guided to the imaging lens 52 by the reflecting mirrors 48 and 50. When the reflecting light from the half mirror 20 passes through the reflecting mirrors 48 and 50, its proceeding direction is bent approximately at a right angle, thereby reaching the imaging lens 52.

The imaging lens 52 focuses the reflecting light from the reflecting mirror 50 into an image such that the pattern of the mask 12 is optically transferred to the photosensitive layer of the exposure subject 14 at an equal magnification factor.

In the aligner 46, a "Dachkantprisma" 54 is arranged on the way of the light path between the imaging lens 52 and the reflecting mirror 26 so as to receive and guide the light from the imaging lens 52 to the reflecting mirror 26.

The Dachkantprisma 54 is a prism which is generally called a prism of the roof type or an Amici Prism, of which the principle, the structure and so forth will be seen in the following reports, articles, literatures and so forth, which are for instance:

T. Tsuruta, "The fifth, PENCIL, OF RAYS," P. 474–476, New Technology Communications, Co., Ltd., March, 2000.

S. Koyanagi, "Optronics, The Optics Dictionary," P. 5, left column, The Optronics Co., Ltd., Jan. 18, 1994.

J. Tsujiuchi, "Introduction to Optics I, foundation and geometrical optics" P. 60–62, the basic lecture on science and technology, $11^{th}$, Asakura Publishing Co., Ltd., Jul. 10, 1989.

In general, the Dachkantprisma is a prism that is used, for instance in a telescope, as an erecting prism system capable of converting the light path, thereby converting an inverted image into an erecting one. In other words, the Dachkantprisma is a prism that changes and guides at least a part of the light path of the light incident thereon in order to invert the up-and-down or the left-and-right side of an image formed by the light before passing through the Dachkantprisma.

It may be possible to obtain the same light path converting function as obtained by the Dachkantprisma 54 by using a Porro prism made up of a plurality of right-angle prisms in place of the Dachkantprisma 54.

The light from the Dachkantprisma 54 is guided to the photosensitive layer of the exposure subject 14 by the reflecting mirror 26.

In the next, the scanning exposure method by the aligner 46 will be described with reference to FIG. 4. Similar to the exposure method used by the aligner 38 as shown in FIG. 2, in the exposure method used by the aligner 46, the following two steps are simultaneously performed; one is the step of guiding the reflecting light from the mask 12 to the exposure subject 14 and exposing it to the above reflecting light, and the other is the step of driving the supporting device 16 by means of the X-Y driving mechanism. With these steps, the entire pattern of the mask 12 is optically transferred to the photosensitive layer of the exposure subject 14.

In the aligner 46, as only single imaging lens is needed, the dimension of the aligner 46 becomes smaller than that of the aligner 38 as shown in FIG. 2. Furthermore, as the imaging system used in the aligner 46 is simplified, the design for obtaining a desirable optical performance such as the image resolution, accuracy and so forth is made easier.

(Fourth Embodiment)

Figure 5:
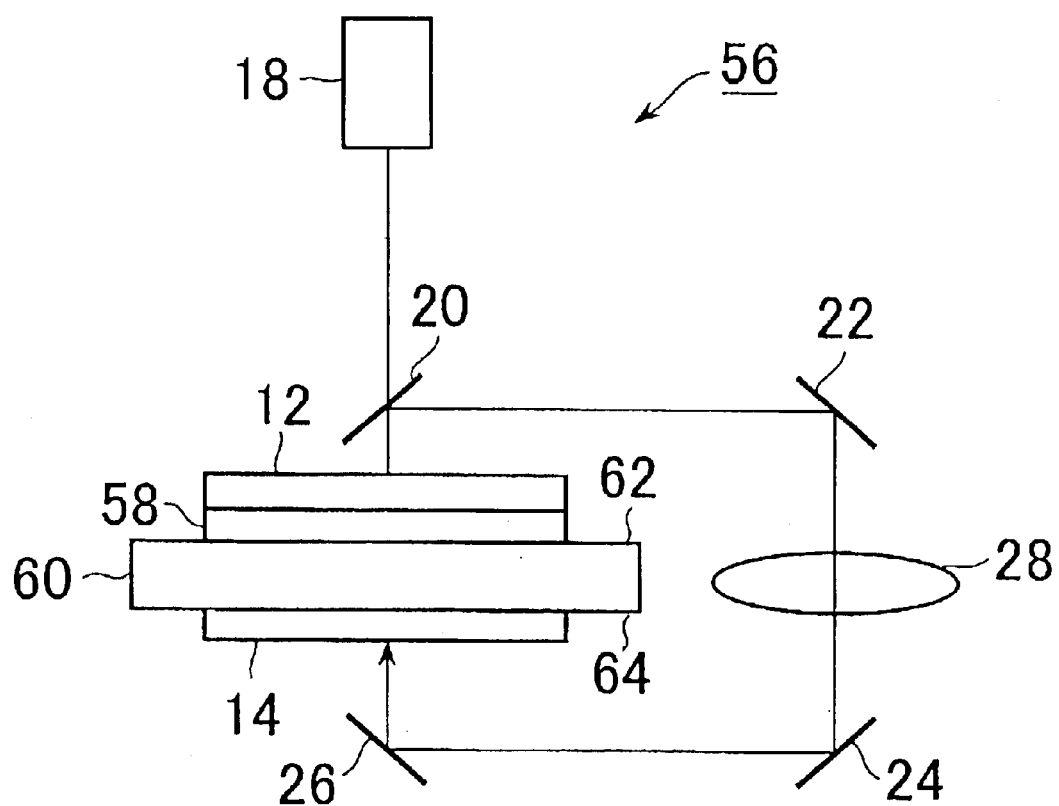
FIG. 5 is a side view showing the fourth embodiment of an aligner according to the invention.

In FIG. 5, an aligner 56 includes parts common to those of the aligners 10 as shown in FIG. 1, which are designated by common reference numerals and signs, and some of which are omitted from FIG. 5 and the light flux is represented by a light lay. As to expression on the various directions such as upward, downward and so forth, the same way as used in FIG. 1 will be applied to this figure.

Referring to FIG. 5, the aligner 56 is provided with a supporting device 60 for supporting an exposure subject 58 in place of the supporting device 16 of the aligner 10 as shown in FIG. 1. This supporting device 60 makes it possible to expose both of the exposure subject 14 and the second exposure subject 58 to the light at a time.

The mask 12 is for instance a mask of the light transmittable type, which includes a glass substrate and a light reflecting metal film in the shape of a predetermined pattern formed on that substrate. In other words, the mask 12 is made up of two portions, one being a light reflecting portion (light blocking portion) which is covered by the metal film formed thereon and the other a light transmittable portion having no metal film.

The exposure subject 58 may be an exposure subject of the type which is made up of for instance a substrate and a photosensitive layer formed thereon. In FIG. 5, the exposure subject 14 has the approximately same dimension as the mask 12.

The supporting device 60 receives the exposure subject 58 at its upside supporting portion 62 such that the photosensitive layer of the exposure subject 58 faces upward. Furthermore, the mask 12 is put on the photosensitive layer such that its metal film side faces upward or downward, and the upside supporting portion 62 is detachably fitted with the exposure subject 58 and the mask 12 by means of the above upside fitting means (not shown).

The upside fitting means has a structure applicable to two exposure ways. That is, if the exposure to the exposure subject 58 is carried out by using a contact exposure method, the upside fitting means has such a structure that allows the mask 12 to be put on the exposure subject 58. On one hand, if the exposure to the exposure subject 58 is carried out by using a proximity exposure method, the upside fitting means has such a structure that allows the mask 12 and the exposure subject 58 to separate from each other by a predetermined distance in the up-and-down direction as shown in FIG. 5.

In order to enhance the alignment accuracy between the exposure subject 58 and the mask 12, it may be possible to take such a structure that the upside fitting means is fitted with only the mask 12 while the upside supporting portion 62 may be fitted with the position adjustment device such as the X-Y-θ table, and this position adjustment device may be fitted with the exposure subject 58.

The supporting device 60 supports the exposure subject 14 in the same way as the supporting device 16 of the aligner 10 as shown in FIG. 1.

In the next, there will be described a collective exposure method by using the aligner 56 with reference to FIG. 5.

The light from the light source passes through the half mirror 20 as well as the light transmittable portion of the mask 12 and is then incident on the photosensitive layer of the exposure subject 58, thereby the photosensitive layer of the exposure subject 58 being exposed to the above light source light. The reflecting light from the light reflecting portion of the mask 12 is guided to the photosensitive layer of the exposure subject 14, thereby the photosensitive layer of the exposure subject 14 being exposed to the above reflecting light.

A photo resist used for forming each photosensitive layer of the exposure subjects 14 and 58 will now be briefly explained. The photosensitive layer of the exposure subject 14 is exposed to the reflecting light from the mask 12 while the photosensitive layer of the exposure subject 58 is exposed to the light passing through the mask 12.

In this case, the pattern image optically transferred to the photosensitive layer of the exposure subject 14 and that which is optically transferred to the photosensitive layer of the exposure subject 58 are inverted each other with respect to the left-and-right direction. However, the inversion problem of the uneven pattern (resist covered portion and resist uncovered portion) appearing after developing the resist can be solved by using two kinds of photo resists, for instance by applying the resist of the positive type to the photosensitive layer of the exposure subject 14 and applying the resist of the negative type to the photosensitive layer of the exposure subject 58.

The merit of the aligner 56 is that each photosensitive layer of two exposure subjects can be exposed at a time with a single exposure operation.

The supporting device 60 as shown in FIG. 5 may be used in place of the supporting device 16 as shown in FIGS. 2 and 4.

While some embodiments of the invention have been shown and described in the above with reference to the accompanying drawings, the invention is not limited to such embodiment. Various changes and modifications will be possible without departing from the gist of the invention.

What is claimed is:

1. An exposure method of exposing an exposure mask pattern on a photosensitive material, comprising:

an incidence step of letting at least a part of light emitted from a light source be incident on said mask supported by a supporting device; and an imaging step of forming an image of said mask pattern on said photosensitive material by guiding the reflecting light from said mask such that said photosensitive material supported by said supporting device receives said reflecting light coming from an incidence direction which is different from said incidence direction of the light incident on said mask, wherein said imaging step comprises:

a direction change step of changing the proceeding direction of said reflecting light from said mask through a half mirror arranged on the way of a light path between said light source and said mask; and further changing the proceeding direction of the light of which the proceeding direction has been changed through a plurality of reflecting morrors and at least one imaging lens, and focusing said light into an image on said photosensitive material.

2. An exposure method as claimed in claim 1, wherein said imaging step further comprising:

a step of changing the proceeding direction of at least a part of the light incident on a light incidence face by using a prism arranged on the way of the light path between said half mirror and said photosensitive material, said prism having one face on which the light is incident and another face from which the incident light comes out.

3. An exposure method as claimed in claim 2, wherein said incidence step further comprises:

a step of letting at least a part of the light incident on said mask be incident on the second photosensitive material supported by said supporting device so as to be on the opposite side of the said mask side.

4. An exposure method as claimed in claim 1, wherein said incidence step further comprising:

a step of letting at least a part of the light incident on said mask be incident on the second photosensitive material supported by said supporting device so as to be on the opposite side of the said mask side.

5. An exposure method of exposing an exposure mask pattern on a photosensitive material, comprising:

an incidence step of letting at least a part of light emitted from a light source be incident on said mask supported by a supporting device;

an imaging step of forming an image of said mask pattern on said photosensitive material by guiding the reflecting light from said mask such that said photosensitive material supported by said supporting device receives said reflecting light coming from an incidence direction which is different from said incidence direction of the light incident on said mask; and a moving step of two-dimensionally and relatively moving the light incident on said mask and the light incident on said photosensitive material and said supporting device, wherein said imaging step comprises:

a direction change step of changing the proceeding direction of said reflecting light from said mask through a half mirror arranged on the way of a light path between said light source and said mask; and further changing the proceeding direction of the light of which the proceeding direction has been changed through a plurality of reflecting mirrors and a least one imaging lens, and focusing said light into an image on said photosensitive material.

6. An exposure method as claimed in claim 4, wherein said imaging step further comprises:

a step of changing the proceeding direction of at least a part of the light incident on a light incidence face by using a prism arranged on the way of the light path between said half mirror and said photosensitive material, said prism having one face on which the light is incident and another face from which the incident light comes out.

7. An exposure method as claimed in claim 6, wherein said incidence step further comprises:

a step of letting at least a part of the light incident on said mask be incident on the second photosensitive material supported by said supporting device so as to be on the opposite side of the said mask side.

8. An exposure method as claimed in claim 5, wherein said incidence step further comprises:

a step of letting at least a part of the light incident on said mask be incident on the second photosensitive material supported by said supporting device so as to be on the opposite side of the said mask side.

9. An exposure method of exposing an exposure mask pattern on a photosensitive material, comprising:

an incidence step of letting at least a part of light emitted from a light source be incident on said mask supported by a supporting device;

an imaging step of forming an image of said mask pattern on said photosensitive material by guiding the reflecting light from said mask such that said photosensitive material supported by said supporting device receives said reflecting light coming from an incidence direction which is different from said incidence direction of the light incident on said mask, wherein said incidence step further comprises:

a step of letting at least a part of the light incident on said mask be incident on the second photosensitive material supported by said supporting device so as to be on the opposite side of the said mask side.

10. An exposure method of exposing an exposure mask pattern on a photosensitive material, comprising:

an incidence step of letting at least a part of light emitted from a light source be incident on said mask supported by a supporting device;

an imaging step of forming an image of said mask pattern on said photosensitive material by guiding the reflecting light from said mask such that said photosensitive material supported by said supporting device receives said reflecting light coming from an incidence direction which is different from said incidence direction of the light incident on said mask; and a moving step of two-dimensionally and relatively moving the light incident on said mask and the light incident on said photosensitive material, and said supporting device, wherein said incidence step further comprises:

a step of letting at least a part of the light incident on said mask be incident on the second photosensitive material supported by said supporting device so as to be on the opposite side of the said mask side.

11. An aligner for exposing an exposure mask pattern on a photosensitive material, comprising:

the first supporting device for supporting said mask such that said mask receives at least a part of the light from said light source;

a second supporting device for supporting said photosensitive material such that said photosensitive material receives light reflecting from said mask from a direction which is different from an incident light direction toward said mask;

a half mirror arranged on the light path between said light source and said mask, said half mirror allowing at least a part of the light from said light source to pass through itself and changing the proceeding direction of reflecting light from said mask; and an imaging optical system for focusing the reflecting light from said half mirror into an image on said photosensitive material, wherein said imaging optical system comprises a plurality of reflecting mirrors arranged on the light path between said half mirror and said photosensitive material, and at least one imaging lens.

12. An aligner as claimed in claim 11, wherein said imaging optical system comprises:

a prism arranged on the light path between said half mirror and said photosensitive material, to change the proceeding direction of at least a part of the light incident thereon, said prism having a light incidence face on which the light is incident and a light exit face from which said incident light comes out.

13. An aligner as claimed in claim 12, wherein said first supporting device supports the second photosensitive material to locate it on the opposite side of said mask side.

14. An aligner as claimed in claim 11, wherein said first supporting device supports the second photosensitive material to locate it on the opposite side of said mask side.

15. An aligner for exposing an exposure mask pattern on a photosensitive material, comprising:

the first supporting device for supporting said mask such that said mask receives at least a part of the light from said light source;

the second supporting device for supporting said photosensitive material such that said photosensitive material receives the reflecting light from said mask from the direction which is different from said incident light direction toward said mask;

a half mirror arranged on the way of the light path between said light source and said mask, said half mirror allowing at least a part of the light from said light source to pass through itself and changing the proceeding direction of the reflecting light from said mask; and an imaging optical system for focusing the reflecting light from said half mirror into an image on said photosensitive material, wherein said first supporting device supports the second photosensitive material to locate it on the opposite side of said mask side.

16. An exposure method comprising:

a positioning step of positioning a mask and an object to be exposed so that optical axes of lights to be incident on respectively said mask and said object to be exposed may align substantially on the same optical axis with said mask supported on one of a surface and a back face provided in a supporting device, and with said object to be exposed supported on the other of said surface and said back face of said supporting device; and an exposing step of making an exposure wherein the exposing step comprises moving said supporting device so that an incident light for exposure may scan faces of said mask and said object to be exposed which are supported by said supporting device.

17. The exposure method of claim 16, wherein the exposing step comprises:

letting reflecting light from said mask supported by said supporting device be incident on said object to be exposed so that optical axes of said reflecting light and light to be incident on said object to be exposed may align substantially on the same optical axis.

18. An exposure method comprising:

a positioning step of positioning a mask, a first object to be exposed and a second object to be exposed so that optical axes of lights to be incident on respectively said mask, said first object to be exposed and said second object to be exposed may align substantially on the same optical axis with said mask and said first object to be exposed supported on one of a surface and a back face provided to a supporting device, and first object being arranged on a light path of said mask, and with said second object to be exposed supported on the other of said surface and said back face of said supporting device; and an exposing step comprising letting reflecting light from said mask supported by said supporting device be incident on said second object to be exposed with optical axes of lights substantially aligned on the same optical axis and simultaneously by letting passing light from said mask be incident on said first object to be exposed.

19. An aligner comprising:

a supporting device having a surface and a back face;

a mask supporting portion provided on one of said surface and back face of said supporting device and for supporting a mask for exposure;

a supporting portion for an object to be exposed, the supporting portion for said object to be exposed being provided on the other of said surface and back face of said supporting device and for supporting said object to be exposed;

an incidence optical system for letting incident light for exposure be incident on said mask for exposure; and an imaging optical system for imaging reflecting light from said mask on said object to be exposed with optical axes substantially aligned on the same optical axis.

20. An aligner as claimed in claim 19, wherein said mask supporting portion of said supporting device is provided with a supporting portion for said object to be exposed arranged on the light path of said mask.

21. An aligner as claimed in claim 19, wherein at least one of said mask supporting portion and said supporting portion for said object to be exposed of said supporting device is provided with a position adjusting device for adjusting the positions of said mask and said object to be exposed.

22. An aligner as claimed in claim 19, wherein a supporting means for supporting said mask and said object to be exposed of said mask supporting portion and the supporting portion for said object to be exposed is an adsorbing means.

* * * * *

UNITED STATES PATENT AND TRADEMARK OFFICE
CERTIFICATE OF CORRECTION

PATENT NO.     : 6,819,401 B2
DATED          : November 16, 2004
INVENTOR(S)    : Susumu Tsujikawa et al.

It is certified that error appears in the above-identified patent and that said Letters Patent is hereby corrected as shown below:

Column 12,
Line 35, should read -- through a plurality of reflecting mirrors and at least one --
Line 54, should read -- said incidence step further comprises: --

Column 13,
Line 16, should read -- through a plurality of reflecting mirrors and at least one --
Line 20, should read -- 6. An exposure method as claimed in claim 5, wherein --

Column 14,
Line 15, should read -- a first supporting device for supporting a mask such --
Line 17, should read -- a light source; --
Line 18, should read -- a second supporting device for supporting a photosen- --

Signed and Sealed this

Second Day of August, 2005

JON W. DUDAS
*Director of the United States Patent and Trademark Office*